(12) United States Patent
Yang et al.

(10) Patent No.: US 11,960,669 B2
(45) Date of Patent: Apr. 16, 2024

(54) DISPLAY DEVICE INCLUDING TOUCH SCREEN FUNCTION

(71) Applicant: LG Display Co., Ltd., Seoul (KR)

(72) Inventors: HeeSeok Yang, Ansan-si (KR); ChoongKeun Yoo, Gimpo-si (KR); Jiho Ryu, Seoul (KR); Jang Jo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 25 days.

(21) Appl. No.: 17/229,620

(22) Filed: Apr. 13, 2021

(65) Prior Publication Data

US 2021/0232250 A1     Jul. 29, 2021

Related U.S. Application Data

(63) Continuation of application No. 15/276,489, filed on Sep. 26, 2016, now Pat. No. 11,009,976.

(30) Foreign Application Priority Data

Sep. 24, 2015  (KR) .......................... 10-2015-0135110

(51) Int. Cl.
*G06F 3/041*     (2006.01)
*G06F 3/044*     (2006.01)
(Continued)

(52) U.S. Cl.
CPC .......... *G06F 3/0412* (2013.01); *G06F 3/0445* (2019.05); *G06F 3/0446* (2019.05); *G06F 3/047* (2013.01); *H10K 50/844* (2023.02); *G06F 2203/04111* (2013.01); *G06F 2203/04112* (2013.01); *H10K 59/38* (2023.02); *H10K 59/40* (2023.02)

(58) Field of Classification Search
CPC ............. G06F 2203/04111; G06F 2203/04112
See application file for complete search history.

(56) References Cited

U.S. PATENT DOCUMENTS 9,236,419 B2   1/2016  Kim
10,055,041 B2  8/2018  Li et al.
(Continued)

FOREIGN PATENT DOCUMENTS

CN    103424912 A    12/2013
CN    103513479 A    1/2014
(Continued)

*Primary Examiner* — William Boddie
*Assistant Examiner* — Bipin Gyawali
(74) *Attorney, Agent, or Firm* — Seed IP Law Group LLP

(57) ABSTRACT

Disclosed is a an in-cell type display device including a touch screen function which is capable of preventing a luminance from being changed in accordance with a viewing angle, and omitting a process of connecting touch electrodes provided in an upper substrate with Tx driver and Rx driver connected with a lower substrate, wherein the display device includes a lower substrate, a thin film transistor layer including thin film transistors provided on the lower substrate, an encapsulation layer provided on the thin film transistor layer, color filters provided on the encapsulation layer, a black matrix provided between the color filters and provided on the encapsulation layer, and first touch electrodes overlapped with the black matrix.

23 Claims, 8 Drawing Sheets

(51) Int. Cl.
*G06F 3/047* (2006.01)
*H10K 50/844* (2023.01)
*H10K 59/38* (2023.01)
*H10K 59/40* (2023.01)

(56) References Cited

U.S. PATENT DOCUMENTS

| | | | |
|---|---|---|---|
| 10,310,650 B2 | 6/2019 | Heo et al. | |
| 2011/0134055 A1 | 6/2011 | Jung et al. | |
| 2012/0038585 A1 | 2/2012 | Kim | |
| 2013/0314371 A1 | 11/2013 | Lee | |
| 2014/0061597 A1 | 3/2014 | Choi et al. | |
| 2014/0125879 A1 | 5/2014 | Chiu et al. | |
| 2014/0184940 A1 | 7/2014 | Ma et al. | |
| 2014/0184945 A1* | 7/2014 | Zhou | G06F 3/0443 349/12 |
| 2014/0353691 A1 | 12/2014 | Lee | |
| 2014/0354560 A1 | 12/2014 | Kim et al. | |
| 2015/0049030 A1* | 2/2015 | Her | G06F 3/0412 345/173 |
| 2015/0206926 A1 | 7/2015 | Hong et al. | |
| 2015/0331508 A1 | 11/2015 | Nho et al. | |
| 2016/0378224 A1* | 12/2016 | Kwon | G06F 3/0445 345/174 |
| 2017/0075452 A1 | 3/2017 | Kim et al. | |
| 2017/0168340 A1* | 6/2017 | Dong | G02F 1/133512 |
| 2018/0182816 A1* | 6/2018 | Kang | G06F 3/0443 |
| 2019/0123112 A1 | 4/2019 | Lee et al. | |

FOREIGN PATENT DOCUMENTS

| | | |
|---|---|---|
| CN | 104111748 A | 10/2014 |
| CN | 104182075 A | 12/2014 |
| CN | 104597646 A | 5/2015 |
| DE | 102010017673 A1 | 6/2011 |
| KR | 10-2015-0020929 A | 2/2015 |
| KR | 10-2015-0086763 A | 7/2015 |

* cited by examiner

DISPLAY DEVICE INCLUDING TOUCH SCREEN FUNCTION

CROSS REFERENCE TO RELATED APPLICATIONS

This application is a continuation of U.S. patent application Ser. No. 15/276,489, filed on Sep. 26, 2016, which claims the benefit of the Korean Patent Application No. 10-2015-0135110, filed on Sep. 24, 2015, which is hereby incorporated by reference as if fully set forth herein.

BACKGROUND

Technical Field

Embodiments of the present invention relate to a display device including a touch screen function.

Description of the Related Art

With the advancement of an information-oriented society, various requirements for the display device of displaying an image are increasing. Thus, there are various display devices of liquid crystal display (LCD) devices, plasma display panel (PDP) devices, organic light emitting display (OLED) devices, etc. Among these display devices, the OLED device has advantages of low-voltage driving, thin profile, wide viewing angle, and rapid response speed.

The OLED device may include a display panel having data lines, scan lines, and a plurality of pixels provided every intersection of the data and scan lines, a scan driver for supplying scan signals to the scan lines, and a data driver for supplying data voltages to the data lines. Each of the pixels may include an organic light emitting diode, a driving transistor for controlling an amount of current supplied to the organic light emitting diode in accordance with a voltage of a gate electrode, and a scan transistor for supplying a data voltage of the data line to the gate electrode of the driving transistor in response to a scan signal of the scan line.

Recently, the OLED device may include a touch screen panel for sensing a user's touch. In this case, the OLED device including the touch screen panel may function as a touch screen apparatus. Recently, the touch screen apparatus is widely applied to home appliances such as a refrigerator, a microwave and a washing machine, as well as monitors for navigation, an industrial terminal, a notebook computer, a banking automation device and a game console. They are also used in mobile terminals such as a smart phone, tablet, mobile phone, MP3, PDA, PMP, PSP, mobile game console, DMB receiver and tablet PC. The touch screen apparatus has become widely used due to its easy operation.

The touch screen apparatus may be largely classified into either an on-cell type in which a touch screen panel is disposed overlaying a display panel, and an in-cell type in which a plurality of touch sensors are prepared by disposing Tx lines and Rx lines in a display panel. In case of an on-cell type OLED device, it has a problem relating a large thickness. Meanwhile, an in-cell type OLED device is advantageous in that it has a relatively-small thickness in comparison to that of the on-cell type OLED device. However, in case the in-cell type OLED device, a distance between an organic light emitting layer and a color filter is increased due to the Tx lines and the Rx lines, whereby a luminance is changed in accordance with a viewing angle. Also, in case of the in-cell type OLED device, the Tx lines and Rx lines are provided on an upper substrate, whereby it needs an additional process of connecting the TX lines and RX lines provided on the upper substrate with Tx driver and Rx driver connected with a lower substrate.

BRIEF SUMMARY

Accordingly, embodiments of the present disclosure are directed to a display device including a touch screen function that substantially reduces one or more problems due to limitations and disadvantages of the related art.

An aspect of embodiments of the present disclosure is directed to provide an in-cell type display device including a touch screen function which facilitates to prevent a luminance from being changed in accordance with a viewing angle.

Another aspect of embodiments of the present disclosure is directed to provide an in-cell type display device including a touch screen function which does not need an additional process of connecting touch lines provided in an upper substrate with Tx driver and Rx driver connected with a lower substrate.

Additional advantages and features of embodiments will be set forth in part in the description which follows and in part will become apparent to those having ordinary skill in the art upon examination of the following or may be learned from practice of embodiments of the invention. The objectives and other advantages of embodiments may be realized and attained by the structure particularly pointed out in the written description and claims hereof as well as the appended drawings.

To achieve these and other advantages and in accordance with the purpose of various inventive embodiments, as broadly described herein, there is provided a display device including a touch screen function that may include a lower substrate, a thin film transistor layer including thin film transistors provided on the lower substrate, an encapsulation layer provided on the thin film transistor layer, color filters provided on the encapsulation layer, a black matrix provided between the color filters and provided on the encapsulation layer, and first touch electrodes that are aligned with and overlap the black matrix. The touch electrodes may overlay the black matrix lines, or the black matrix lines may overlay the touch electrodes, according to various embodiments.

It is to be understood that both the foregoing general description and the following detailed description of embodiments of the present disclosure are exemplary and explanatory and are intended to provide further explanation of the invention as claimed.

BRIEF DESCRIPTION OF THE SEVERAL VIEWS OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
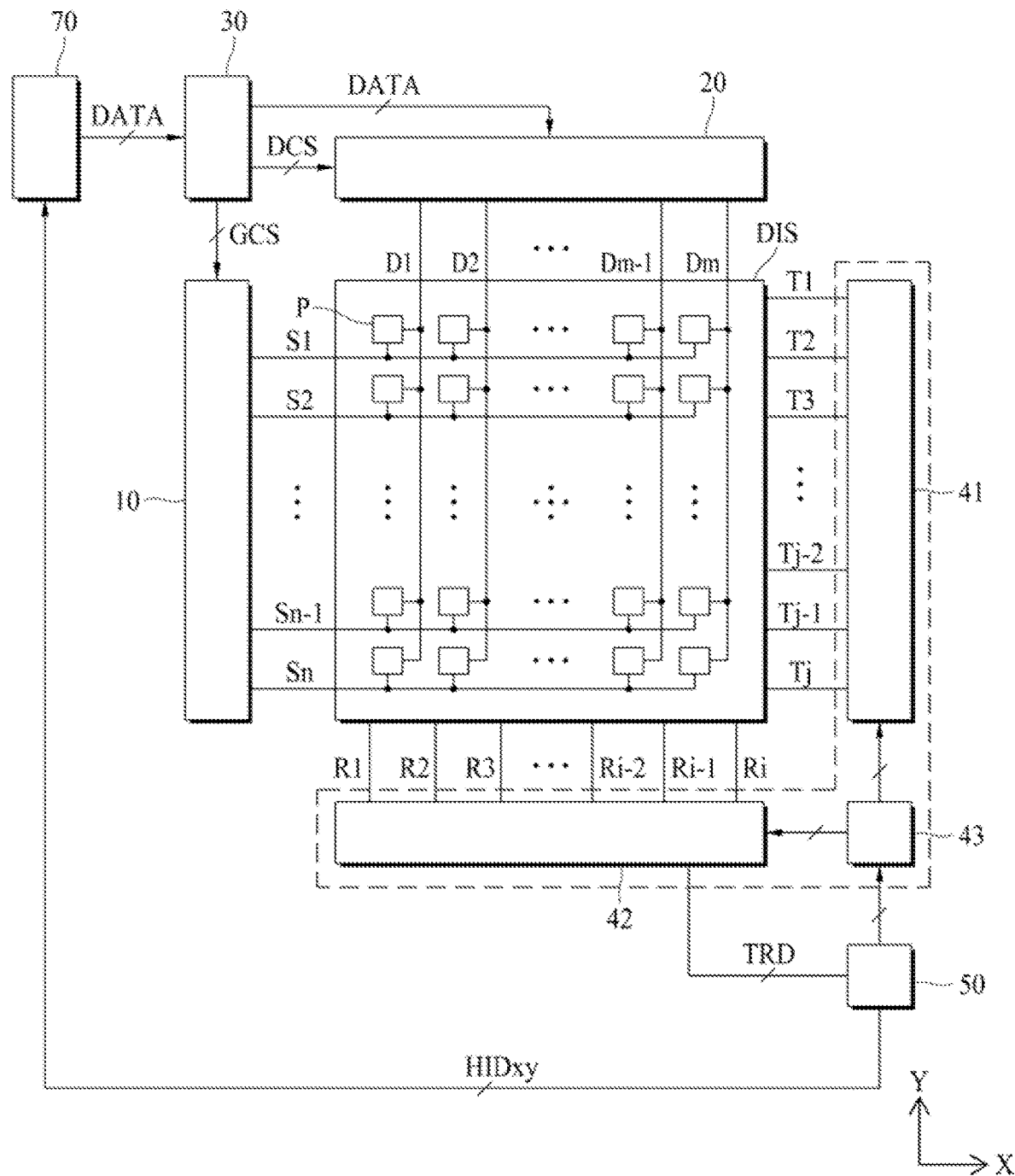
FIG. 1 is a block diagram illustrating a display device including a touch screen function according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Further, the present invention is only defined by the claims.

A shape, a size, a ratio, an angle, and a number disclosed in the drawings for describing embodiments of the present invention are merely an example, and thus, the present invention is not limited to the illustrated details. Like reference numerals refer to like elements throughout. When the detailed description of a known function or configuration is determined to unnecessarily obscure the explanation of various embodiments, a detailed description will be omitted, since it is known to those of skill in the art.

In a case where 'comprise', 'have', and 'include' described in the present specification are used, another part may be added unless 'only~' is used. The terms of a singular form may include plural forms unless referred to the contrary.

In construing an element, the element is to be construed as including some tolerance for errors, although there is no explicit description.

In describing a position relationship, for example, when the positional order is described as 'on~', 'above~', 'below~', and 'next~', a case which is not contact may be included unless a variation of the word is used in addition.

In describing a time relationship, for example, when the temporal order is described as 'after~', 'subsequent~', 'next~', and 'before~', a case which is not continuous or has intervening steps may be included unless further limiting words are expressly added, such as 'just' or 'direct.'

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a display device including a touch screen function according to the embodiment of the present invention will be described with reference to the accompanying drawings.

FIG. 1 is a block diagram illustrating a display device including a touch screen function according to one embodiment of the present invention. Referring to FIG. 1, the display device including the touch screen function according to one embodiment of the present invention may include a display panel (DIS), a gate driver 10, a data driver 20, a timing controller 30, a touch driver 40, a touch coordinates calculator 50, and a system board 70.

The display device including the touch screen function according to the embodiment of the present invention may be realized in various flat display devices, for example, liquid crystal display (LCD) device, field emission display (FED) device, plasma display panel (PDP), organic light emitting display (OLED) device, electrophoresis (EPD) device, and etc. Hereinafter, the display device including the touch screen function according to one embodiment of the present disclosure will be described as realized in the OLED device, but is not limited to this type.

The display panel DIS may include a display area with pixels (P) prepared to display an image. The display panel DIS may include data lines (D1~Dm, 'm' is an integer of 2 or more than 2), and scan lines (S1~Sn, 'n' is an integer of 2 or more than 2). The data lines (D1~Dm) intersect with the scan lines (S1~Sn).

Each of the pixels (P) of the display panel 10 is connected with any one of the data lines (D1~Dm) and any one of the scan lines (S1~Sn), as shown in FIG. 1. Each of the pixels (P) of the display panel 10 may include a driving transistor for controlling a drain-to-source current in accordance to a data voltage supplied to a gate electrode, a scan transistor for supplying the data voltage of the data line to the gate electrode of the driving transistor, wherein the scan transistor is turned-on by a scan signal of the scan line, an organic light emitting diode which emits light in accordance with the drain-to-source current of the driving transistor, and a capacitor for maintaining the voltage in the gate electrode of the driving transistor for a preset time period.

The gate driver 10 receives a gate scan control signal (GCS) from the timing controller 30. The gate driver 10 supplies the scan signals to the scan lines (S1~Sn) in accordance with the gate scan control signal (GCS).

The data driver 20 receives digital video data (DATA) and data control signal (DCS) from the timing controller 30. The data driver 20 converts the digital video data (DATA) to an analog positive/negative data voltage in accordance with the data control signal (DCS), and supplies the analog positive/negative data voltage to the data lines. That is, the pixels to be supplied with the data voltages are selected by the scan signals of the gate driver 10, and the data voltages are supplied to the selected pixels.

The timing controller 30 receives digital video data (DATA) and timing signals from the system board 70. The timing signals may include vertical synchronization signal, horizontal synchronization signal, data enable signal, dot clock, and etc. The vertical synchronization signal defines 1 frame period. The horizontal synchronization signal defines 1 horizontal period needed to supply the data voltages to the pixels for 1 horizontal line of the display panel (DIS). The data enable signal defines a period of inputting valid data. The dot clock is a signal which is repeated every preset short time period.

The timing controller 30 generates a source timing control signal (DCS) for controlling an operation timing of the data driver 20, and a gate scan control signal (GCS) for controlling an operation timing of the gate driver 10 on the basis of timing signals so as to control the operation timing of each of the gate driver 10 and the data driver 20. The timing controller 30 outputs the gate control signal (GCS) to the gate driver 10, and outputs the digital video data (DATA) and the data control signal (DCS) to the data driver 20.

The system board 70 may be realized in a navigation system, set top box, DVD player, Blu-ray player, personal computer (PC), home theater system, broadcasting receiver, phone system, and etc. The system board 70 includes SoC (system on chip) with a scaler, which enables to convert digital video data (DATA) of input image into a format appropriate for display on the display panel (DIS). The system board 70 transmits the digital video data (DATA) and timing signals to the timing controller 30.

On the display panel DIS, there are first touch sensing lines (T1~Tj, 'j' is an integer of 2 or more than 2), and second touch sensing lines (R1~Ri, 'i' is an integer of 2 or more than 2) as well as the data lines (D1~Dm) and the scan lines (S1~Sn). The first touch sensing lines (T1~Tj) may intersect with the second touch sensing lines (R1~Ri).

Touch sensors may be formed at respective intersections of the first touch sensing lines (T1~Tj) and the second touch sensing lines (R1~Ri). According to the embodiment of the present invention, each of the touch sensors according to the embodiment of the present invention may be realized by a mutual capacitance, but not limited to this type.

The display device according to the embodiment of the present invention is formed in an in-cell type wherein the first touch sensing lines (T1~Tj) and the second touch sensing lines (R1~Ri) are provided in the display panel (DIS). That is, the display device according to the embodiment of the present invention may be realized in a display device including the touch screen function inside the display panel. In FIG. 1, for convenience of explanation, the first touch sensing lines (T1~Tj) are the Tx lines for supplying a driving pulse, and the second touch sensing lines (R1~Ri) are the Rx lines for sensing the change of charge amount in each of the touch sensors.

The touch driver 40 supplies the driving pulse to the first touch sensing lines (T1~Tj), and senses the change of charge amount in each of the touch sensors through the second touch sensing lines (R1~Ri) in synchronization with the driving pulse. The touch driver 40 may include a TX driver 41, an Rx driver 42, and a touch controller 43. The Tx driver 41, the Rx driver 42, and the touch controller 43 may be integrated into one ROIC (read-out IC).

The Tx driver 41 selects the first touch sensing line to be supplied with the driving pulse under control of the touch controller 43, and supplies the driving pulse to the selected first touch sensing line. For example, the Tx driver 41 may supply the driving pulses to the first touch sensing lines (T1~Tj) in sequence.

The Rx driver 42 selects the second touch sensing lines to be received with the change of charge amount in the touch sensors under control of the touch controller 43, and receives the change of charge amount in the touch sensors through the selected second touch sensing lines. For example, the Rx driver 42 may receive the change of charge amount in the touch sensors of one pair of the second touch sensing lines.

The Rx driver 42 samples the change of charge amount in the touch sensors, which is received through the second touch sensing lines (R1~Ri), and converts the sampled change of charge amount into touch raw data (TRD) of digital data.

The touch controller 43 generates a TX setup signal for setting the first touch sensing line to be supplied with the driving pulse by the Tx driver 41, and an Rx setup signal for setting the second touch sensing line to be received with a touch sensor voltage by the Rx driver 42. Also, the touch controller 43 generates timing signals for controlling an operation timing of each of the TX driver 41 and the Rx driver 42.

The touch coordinates calculator 50 receives the touch raw data (TRD) from the touch driver 40. The touch coordinates calculator 50 calculates the touch coordinates in accordance with a touch coordinates calculation method, and outputs touch coordinates data (HIDxy) including the touch coordinates information to the system board 70.

The touch coordinates calculator 50 may be realized in MCU (micro controller unit). The system board 70 analyzes the touch coordinates data (HIDxy) which is provided from the touch coordinates calculator 50, and executes an application program linked with the coordinates of a user's touch based on the analyzed data result. The system board 70 transmits the digital video data (DATA) and timing signals to the timing controller 30 in accordance with the executed application program.

Figure 2A:
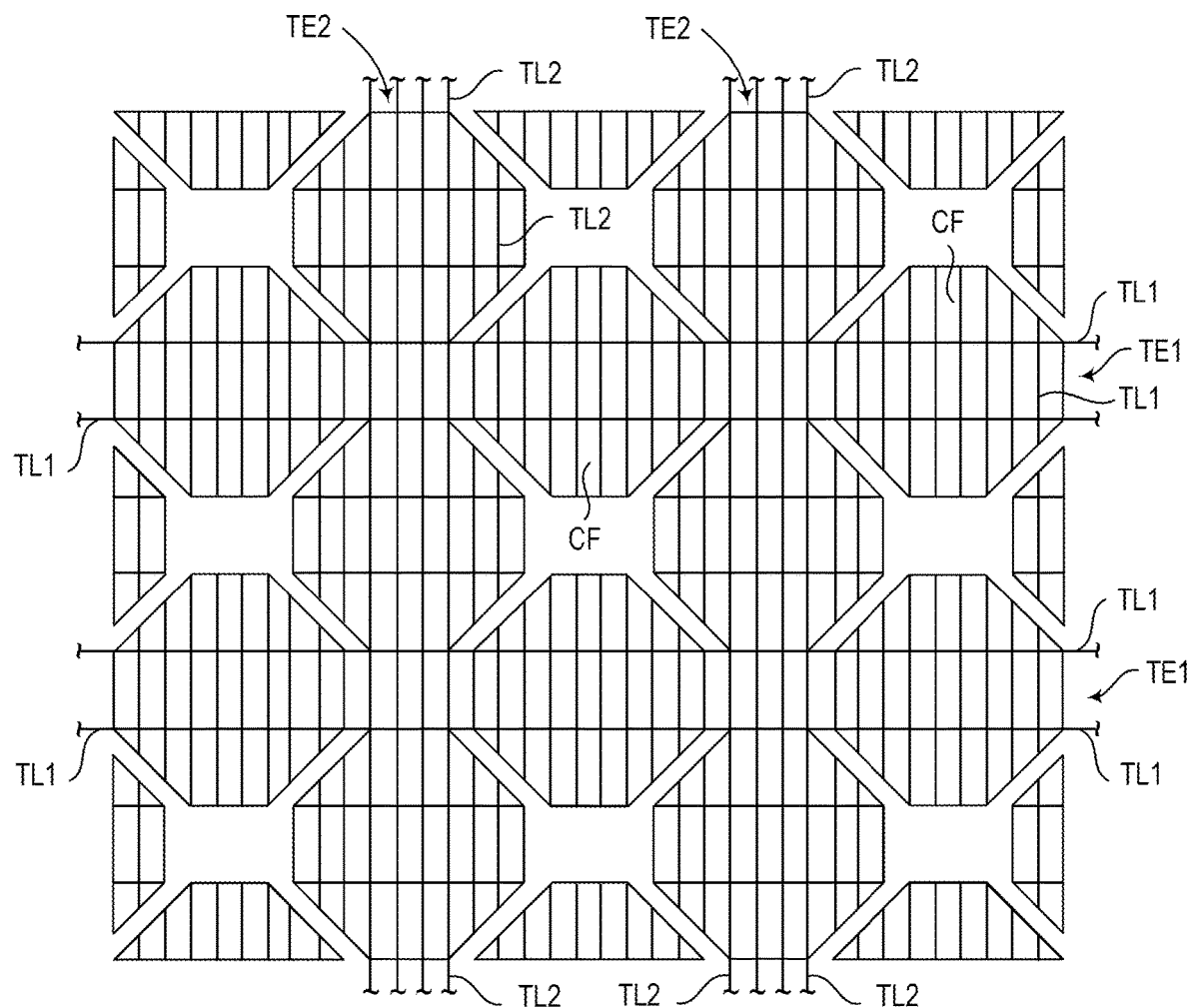
FIG. 2A is a plane view illustrating rows of the first touch electrodes and columns of the second touch electrodes in a display panel according to one embodiment of the present disclosure.

FIG. 2A is a plan view showing the rows and columns of the touch electrodes in a large array. In particular, FIG. 2A shows a first row and a second row of touch electrodes TE1 that extend in a horizontal line, one above the other. It also shows a first column and a second column of touch electrodes TE2 that extend in a vertical line, one next to the other. A combination display and touch panel will normally have several hundred lines of touch electrodes TE1 and TE2, and in a large panel, may have several thousand such rows and columns.

Figure 2B:
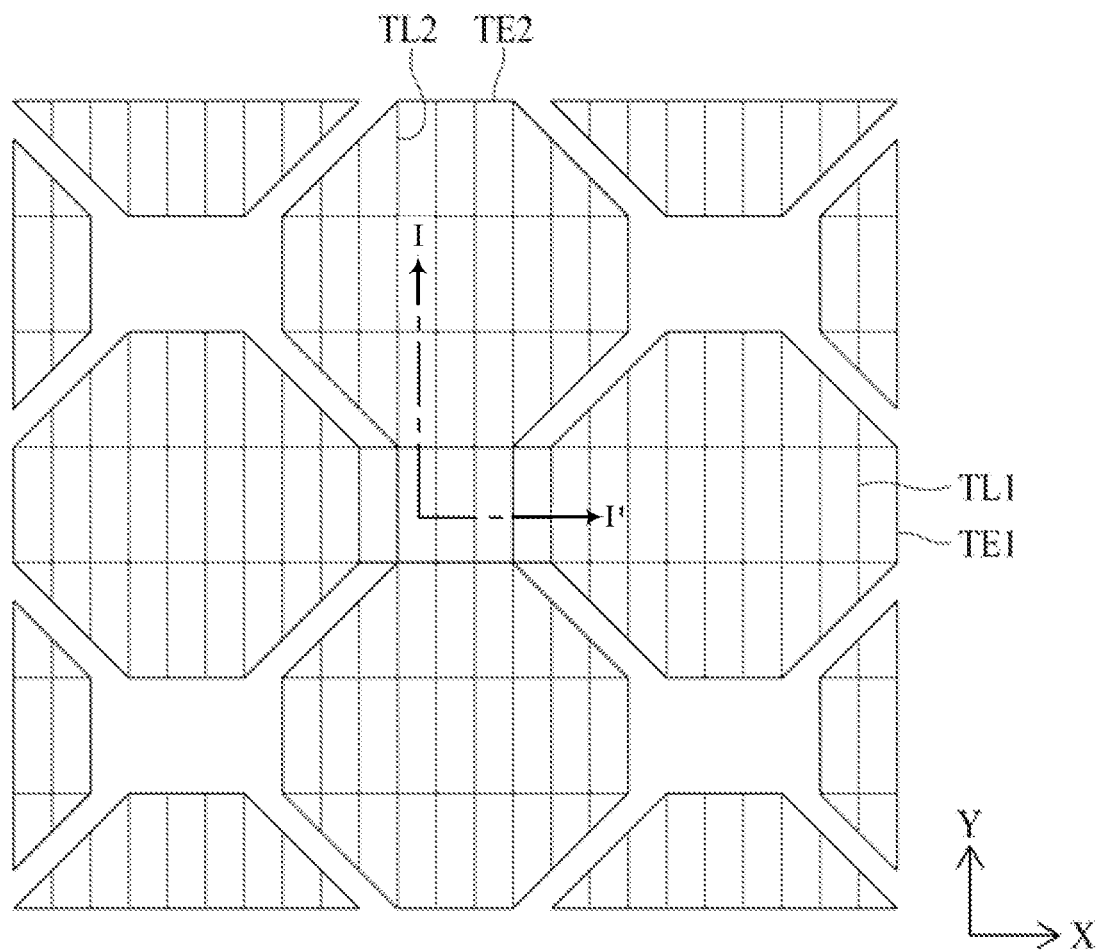
FIG. 2B is an enlarged plane view illustrating first touch electrodes and second touch electrodes in a display panel according to one embodiment of the present disclosure.
Figure 3A:
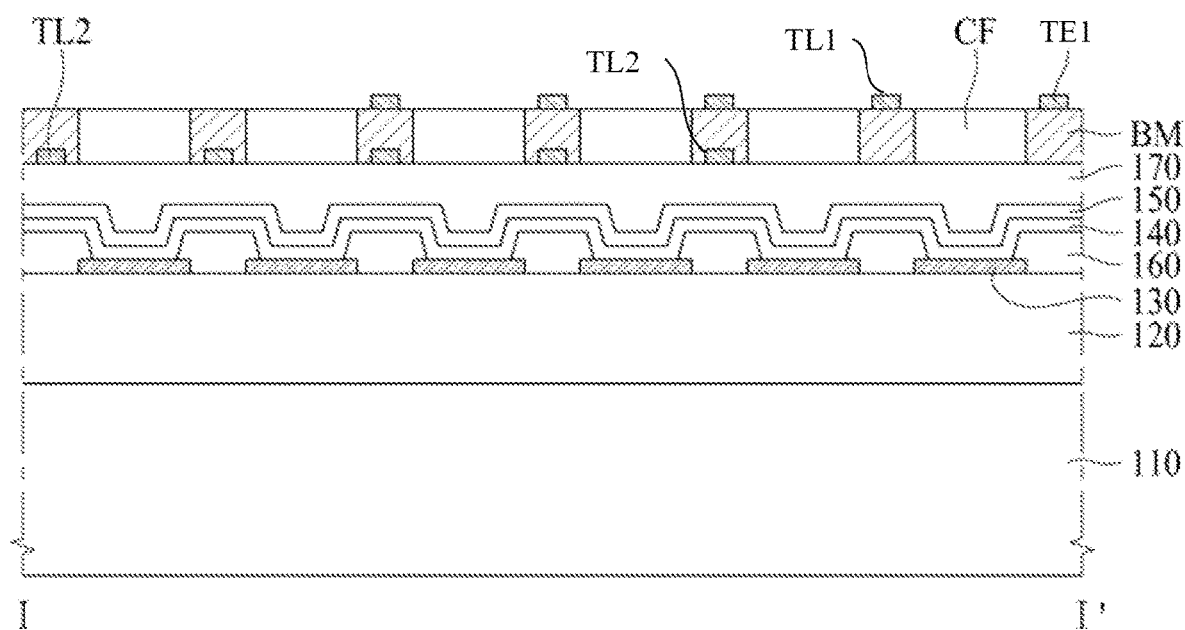
FIG. 3A is a cross sectional view illustrating one embodiment along I-I' of FIG. 2B.
Figure 3B:
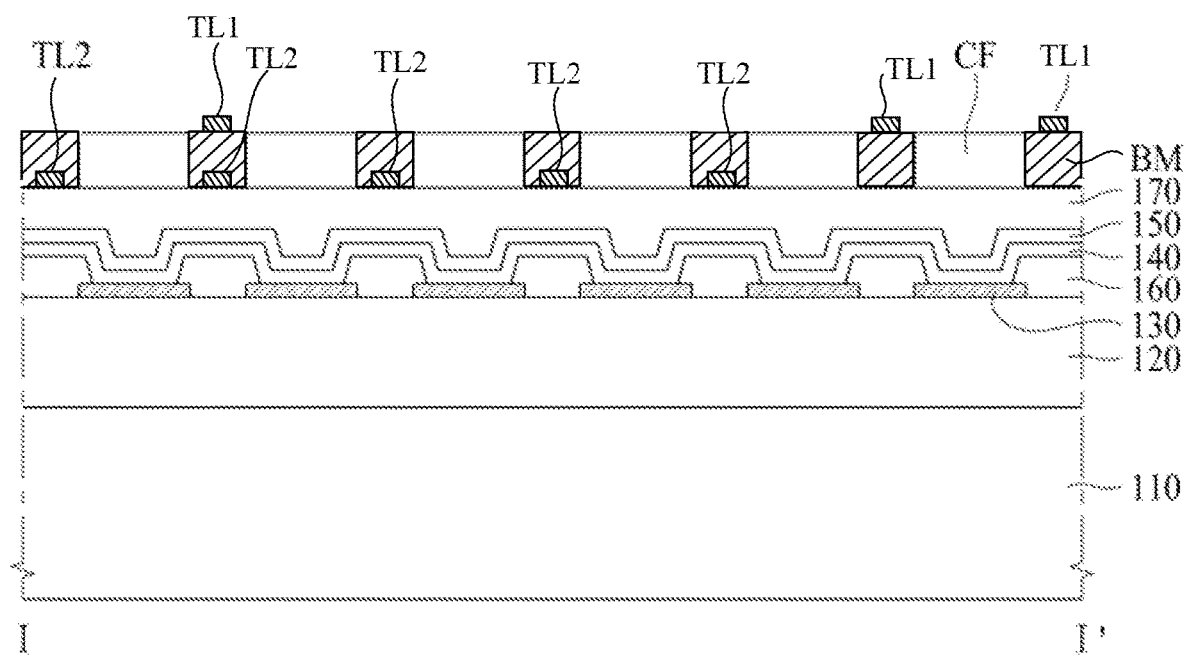
FIG. 3B is a cross sectional view illustrating a second embodiment along I-I' of FIG. 2B.

As can be seen in FIG. 2A, each touch electrode TE is in the shape of an octagon. It could be other shapes, such as a square, hexagon or the like. Each touch electrode TE is composed of a number conductive lines. The conductive lines TL1 comprise the touch electrodes TE1 that extend in rows and the conductive lines TL2 comprise the touch electrodes TE2. The electrodes TL1 extend from one row touch electrode TE1 to the next adjacent one, electrically connecting them to each other. Thus, all touch electrodes TE1 in the same row are electrically connected to each other. Each row of TE1 is electrically isolated from each other row. They can be individually addresses as rows by line T1, T2 . . . Tj as shown in FIG. 1. In a similar manner, each individual touch electrode TE2 is the same column are connected to each other by conductive lines TL2 and each column is electrically isolated from each other column. Each column can be individually addresses as column by lines R1, R2 . . . Ri as shown in FIG. 1. The lines TL1 and TL2 are electrically isolated from each other by having an insulator between them at locations where they cross on top of each other, as can be seen in FIGS. 3A and 3B. In between the lines TL1 and TL2 color filters CF are present, as explained elsewhere herein. FIG. 2B is an enlarged plane view illustrating first touch electrodes and second touch electrodes in the display panel according to one embodiment of the present disclosure. For convenience of explanation, FIG. 2B shows only the first touch electrodes (TE1) and second touch electrodes (TE2).

Referring to FIG. 2A, the first touch electrodes (TE1) arranged in the first direction (X-axis direction) are connected with one another, and the second touch electrodes (TE2) arranged in the second direction (Y-axis direction) are connected with one another. The first direction (X-axis direction) may be parallel to the scan lines (S1~Sn) and the second direction (Y-axis direction) may be parallel to the data lines (D1~Dm) as shown in FIG. 2A, or the first direction (X-axis direction) may be parallel to the data lines (D1~Dm) and the second direction (Y-axis direction) may be parallel to the scan lines (S1~Sn).

Each of the first touch electrodes (TE1) connected in a line extending in the first direction (X-axis direction) is electrically insulated from the first touch electrodes (TE1) neighboring to it in the second direction (Y-axis direction). Each of the second touch electrodes (TE2) connected in a line extending in the second direction (Y-axis direction) is electrically insulated from the second touch electrodes (TE2) neighboring to it in the first direction (X-axis direction).

Figure 5:
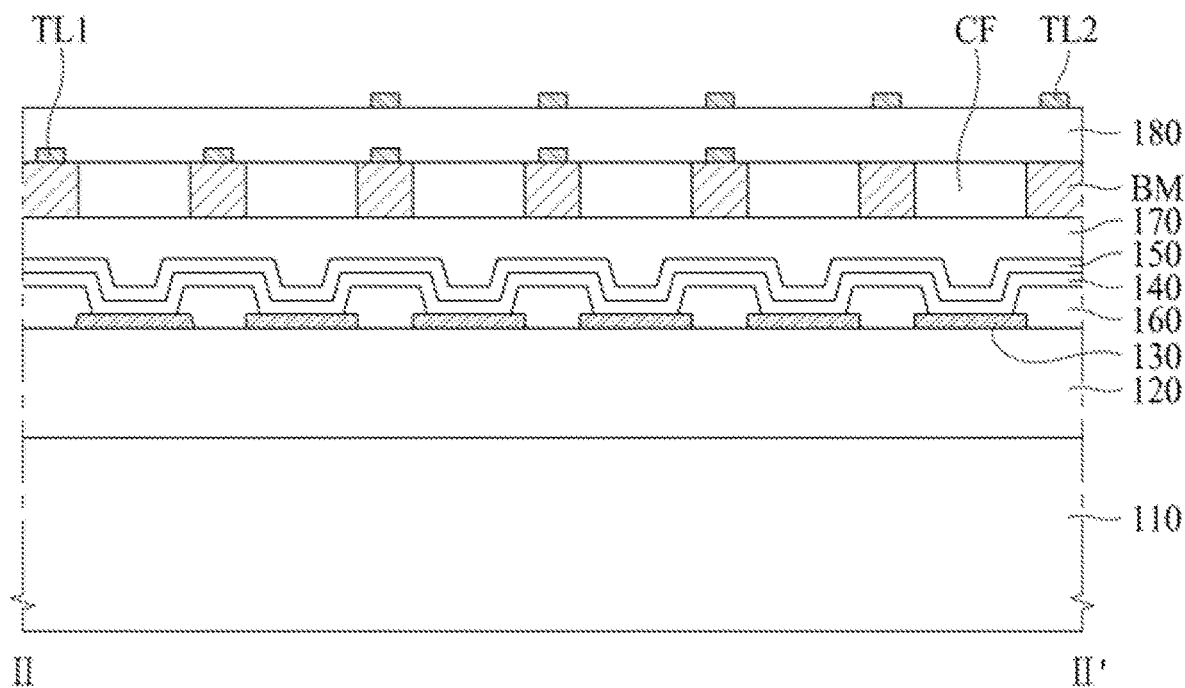
FIG. 5 is a cross sectional view illustrating another embodiment along I-I' of FIG. 2B.

As shown in FIGS. 3 and 5, the first touch electrodes (TE1) are formed in the different layer from the second touch electrodes (TE2), whereby the first touch electrodes (TE1) are electrically insulated from the second touch electrodes (TE2). A position of forming the first touch electrodes (TE1) and the second touch electrodes (TE2) will be described in detail with reference to FIGS. 3 and 5.

The first touch electrodes (TE1) connected in the first direction (X-axis direction) may be connected with any one of the first touch sensing lines (T1~Tj) connected with the Tx driver 41. Accordingly, the first touch electrodes (TE1) connected in the first direction (X-axis direction) may be supplied with the driving pulse from the Tx driver 41.

The second touch electrodes (TE2) connected in the second direction (Y-axis direction) may be connected with any one of the second touch sensing lines (R1~Ri) connected with the Rx driver 42. Accordingly, the Rx driver 42 may be supplied with the change of charge amount in the touch sensors from the second touch electrodes (TE2) connected in the second direction (Y-axis direction). The touch sensors may be the mutual capacitance formed between the first touch electrodes (TE1) and the second touch electrodes (TE2).

Each of the first touch electrodes (TE1) may be formed to include first touch lines (TL1) arranged in a mesh-type configuration. The first touch electrodes (TE1) may be connected with the touch electrodes (TE1) neighboring in the first direction (X-axis direction) through the first touch lines (TL1) arranged in the mesh-type configuration. Preferably, the first touch electrodes (TE1) and lines (TL1) are formed of an opaque metal material so as to lower a resistance. In this case, in order to prevent a loss of an opening area, the first touch electrodes (TE1) and lines (TL1) may be covered by a black matrix (BM), or may be disposed on the black matrix (BM), as shown in FIGS. 3 and 5. Thus, the first touch lines (TL1) may be arranged in a mesh-type configuration which is very similar to a plane shape of the black matrix (BM), which is also in a mesh of repeating octagons.

Each of the second touch electrodes (TE2) may include second touch lines (TL2) arranged in a mesh-type configuration. The second touch electrodes (TE2) may be connected with the touch electrodes (TE2) neighboring in the second direction (Y-axis direction) through the second touch lines (TL2) arranged in the mesh-type configuration. Preferably, the second touch lines (TL2) are formed of an opaque metal material so as to lower a resistance. In this case, in order to prevent a loss of an opening area, the second touch lines (TL2) may be covered by or on top of a black matrix (BM), or may be disposed on the black matrix (BM), as shown in FIGS. 3 and 5. Thus, the second touch lines (TL2) may be arranged in a mesh-type configuration which is very similar to a plane shape of the black matrix (BM).

In FIGS. 2A and 2B, each of the first touch electrodes (TE1) and the second touch electrodes (TE2) has a plane shape of an octagon, but not limited to this shape. FIG. 3A is a cross sectional view illustrating one example along I-I' of FIG. 2B according to one embodiment. In the embodiment, as shown in FIG. 3A, the lines TL1 and TL2 are located both above and below the black matrix lines BM. The top lines can be part of TE1 or TE2, depending on their location in the matrix. The bottom lines can be part of TE1 or TE2 and are electrically isolated from the top lines. Thus, the bottom lines can be part of TL1 and thus part of TE1 when the top lines are TL2 and part of TE2, or vice versa. Alternatively, the top lines and bottom lines can be tied to the same voltage to reduce the resistance.

FIG. 3B shows a different embodiment for the location of the lines TL1 and TL2. As can be seen in FIGS. 2A and 2B, each electrode TE1 and TE2 is comprised of lines TL1 and TL2 that can extend either vertically or horizontally, depending on where they are located in the electrode. The layout of the electrodes is therefore very easy to construct and can be made with a simple masking patterns. The lines of TL1 and TL2 that make up the electrodes TE1 and TE2 can each be located either under the layer BM or on top of the layer BM in any combination that provides the electrical isolation.

Figure 4:
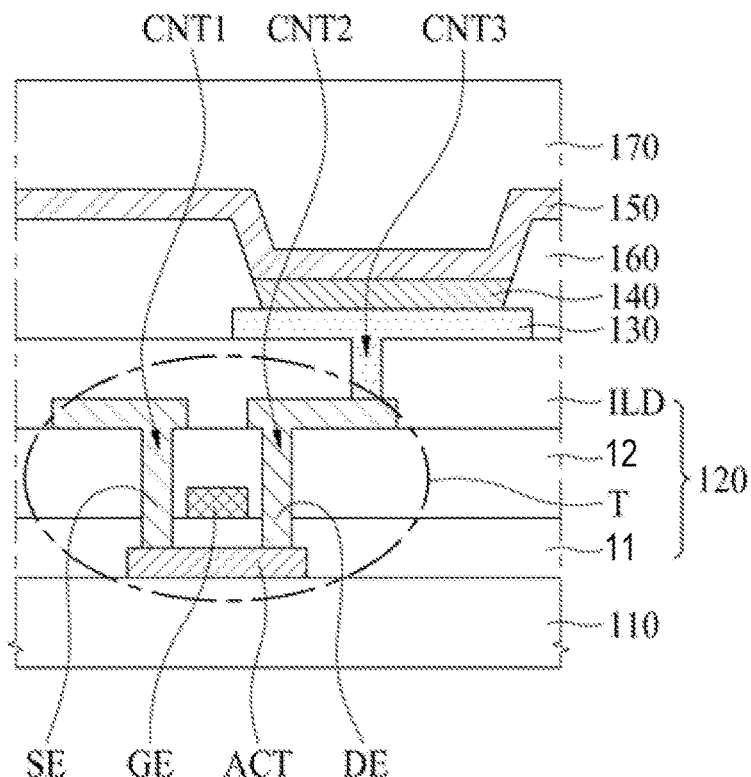
FIG. 4 is a cross sectional view illustrating a TFT layer, an anode electrode, an organic layer, a cathode electrode, and an encapsulation layer of FIG. 3A.

FIG. 4 is a cross sectional view illustrating a TFT layer, an anode electrode, an organic layer, a cathode electrode, and an encapsulation layer of FIGS. 3A and 3B. For convenience of explanation, FIG. 4 shows the TFT layer, the anode electrode, the organic layer, the cathode electrode, and the encapsulation layer included in any one pixel.

Referring to FIGS. 3A and 4, a thin film transistor layer (hereinafter, referred to as "TFT layer" 120) is provided on a lower substrate 110, and thin film transistors (T) are provided in the TFT layer 120. FIGS. 3A and 3B do not show the details of the TFT in layer 120 to avoid a crowded view; these are shown in FIG. 4. It can also be appreciated that the TFT structures can be located in all regions of the DIS 10, not just under the TE1 and TE2. This display DIS is composed of first layer of light emitting structures as shown in FIG. 4, having a TFT and an OLED in each pixel. The touch electrodes are overlaid on the display elements to form one integrated display that has both a light emitting layer and a touch sensitive layer.

In detail, the thin film transistor (T) may include an active layer (ACT) prepared on the lower substrate 110, a first insulating film 11 prepared on the active layer (ACT), a gate electrode (GE) prepared on the first insulating film 11, a second insulating film 12 prepared on the gate electrode (GE), and source and drain electrodes (SE, DE) prepared on the second insulating film 12 and connected with the active layer (ACT) via first and second contact holes (CNT1, CNT2). The gate electrode (GE) is formed in the same layer as the scan lines (S1~Sn), and the source and drain electrodes (SE, DE) are formed in the same layer as the data lines (D1~Dm). FIG. 4 shows the transistor (T) of a top gate method, but not limited to this method. For example, the transistor (T) may be formed in a bottom gate method.

The anode electrode 130 is provided on the TFT layer 120. In detail, the anode electrode 130 is connected with the drain electrode (DE) of the transistor (T) via a third contact hole (CNT3) penetrating through an insulating interlayer (ILD) prepared on the source electrode (SE) and the drain electrode (DE) as shown in FIG. 4.

The anode electrode 130 may be patterned in every pixel as shown in FIG. 3A. Accordingly, a bank 160 is prepared between the neighboring anode electrodes 130, and the neighboring anode electrodes 130 are electrically insulated from each other by the bank 160.

On the anode electrodes 130 and the banks 160, there is an organic light emitting layer 140. The organic light emitting layer 140 may include a hole transporting layer, an organic layer, and an electron transporting layer. The cathode electrode 150 is prepared on the organic light emitting layer 140 and the bank 160. If a voltage is applied to the anode electrode 130 and the cathode electrode 150, hole and electron are transferred to the organic layer through the hole transporting layer and the electron transporting layer, and are then combined in the organic layer, to thereby emit light.

In FIG. 4, the organic light emitting display device is formed of a front-surface top emission method, but not necessarily. For example, the organic light emitting display device may be formed of a rear-surface top emission method.

In case of the front-surface top emission method, light emitted from the organic light emitting layer 140 proceeds toward a direction of an upper substrate, whereby the transistor (T) is largely prepared under the bank 160 and the anode electrode 130. Thus, a design area of the transistor (T) in the front-surface top emission method is relatively larger than a design area of the transistor (T) in the rear-surface top emission method. In case of the front-surface top emission method, the anode electrode 130 is formed of a metal material with high reflectance, for example, aluminum (Al) or deposition structure of aluminum (Al) and indium-tin-oxide (ITO) so as to obtain a micro-cavity effect, preferably. Also, in case of the front-surface top emission method, the cathode electrode 150 is formed of a transparent metal material, for example, indium-tin-oxide (ITO) or indium-zinc-oxide (IZO), preferably.

The encapsulation layer 170 is provided on the cathode electrode 150. The encapsulation layer 170 may include an organic-inorganic composite membrane, and a planarization layer. The organic-inorganic composite membrane is provided to protect the organic light emitting layer 140 and the cathode electrode 150 from moisture and oxygen. The organic-inorganic composite membrane may include a first inorganic film for covering the cathode electrode 150, an organic film for covering the first inorganic film, and a second inorganic film for covering the organic film. For planarization of the organic-inorganic composite membrane, the planarization layer may be provided on the organic-inorganic composite membrane.

The second touch electrodes (TE2) are provided on the encapsulation layer 170. The second touch electrodes (TE2) may be formed of an opaque metal material, and may be provided in the areas corresponding to the banks 160.

Also, the black matrix (BM) and color filters (CF) are provided on the encapsulation layer 170. Also, the black matrix (BM) is provided in the areas corresponding to the banks 160, whereby the second touch electrodes (TE2) are covered by the black matrix (BM). The color filters (CF) are provided in between every black matrix (BM). Each of the color filters (CF) may be any one among red, green, and blue color filters, but not limited to these colors.

The first touch electrodes (TE1) are provided on the black matrix (BM). The first touch electrodes (TE1) may be formed of an opaque metal material.

In order to lower a resistance, the first and second touch electrodes (TE1, TE2) are formed of a conductive material with low resistance, preferably. Thus, the first and second touch electrodes (TE1, TE2) are formed of an opaque metal material such as copper (Cu) or aluminum (Al) instead of a transparent metal material such as ITO or IZO. According as the first and second touch electrodes (TE1, TE2) are formed of the opaque metal material, the first and second touch electrodes (TE1, TE2) are covered by the black matrix (BM) so as to prevent a loss of an open area, preferably.

As described above, the first and second touch electrodes (TE1, TE2) are formed in the same layer as the black matrix (BM) and color filters (CF). As a result, even though the touch electrodes are formed in the in-cell type display panel, the distance between the organic light emitting layer and the color filter is not increased so that it is possible to prevent a luminance from being changed in accordance with a viewing angle. Also, the touch electrodes are formed in the lower substrate, whereby there is no need for an additional process of connecting the touch electrodes provided in the upper substrate with the Tx driver and the Rx driver provided in the lower substrate.

FIG. 5 is a cross sectional view illustrating another example along I-I' of FIG. 2B. A TFT layer 120 shown in FIG. 5 is the same as the TFT layer shown in FIG. 4, therefore a detailed description for the TFT layer will be omitted. Also, anode electrodes 130, an organic light emitting layer 140, a cathode electrode 150, banks 160, and an encapsulation layer 170 shown in FIG. 5 are the same as those described with reference to FIG. 3A, therefore a detailed description for those shown in FIG. 5 will be omitted.

Referring to FIG. 5, a black matrix (BM) and color filters (CF) are provided on the encapsulation layer 170. The black matrix (BM) may be provided in the areas corresponding to the banks 160, and the color filters (CF) are provided every black matrix (BM). Each of the color filters (CF) may be any one among red, green, and blue color filters, but not limited to these colors.

The first touch electrodes (TE1) are provided on the black matrix (BM). The first touch electrodes (TE1) may be formed of an opaque metal material.

An insulating film 180 may be provided on the black matrix (BM), the color filters (CF), and the first touch electrodes (TE1). The insulating film 180 is provided to insulate the first touch electrodes (TE1) from the second touch electrodes (TE2).

The second touch electrodes (TE2) are provided on the insulating film 180, wherein the second touch electrodes (TE2) are disposed in the areas corresponding to the black matrix (BM). The second electrodes (TE2) may be formed of an opaque metal material.

In FIG. 5, the first touch electrodes (TE1) are provided under the insulating film 180, and the second touch electrodes (TE2) are provided on the insulating film 180, but not limited to this structure. That is, the second touch electrodes (TE2) may be provided under the insulating film 180, and the first touch electrodes (TE1) may be provided on the insulating film 180.

In order to lower a resistance, the first and second touch electrodes (TE1, TE2) are formed of a conductive material with low resistance, preferably. Thus, the first and second touch electrodes (TE1, TE2) are formed of an opaque metal material such as copper (Cu) or aluminum (Al) instead of a transparent metal material such as ITO or IZO. Accordingly, as the first and second touch electrodes (TE1, TE2) are formed of the opaque metal material, preferably, the first touch electrodes (TE1, TE2) are provided in the area corresponding to the black matrix (BM), and the second touch electrodes (TE2) are provided on the black matrix (BM), to thereby prevent a loss of an open area.

As described above, the first and second touch electrodes (TE1, TE2) are formed on the black matrix (BM) and color filters (CF). As a result, even though the touch electrodes are formed in the in-cell type display panel, the distance between the organic light emitting layer and the color filter is not increased so that it is possible to prevent a luminance from being changed in accordance with a viewing angle. Also, the touch electrodes are formed in the lower substrate, whereby there is no need for an additional process of connecting the touch electrodes provided in the upper substrate with the Tx driver and the Rx driver provided in the lower substrate.

Figure 6:
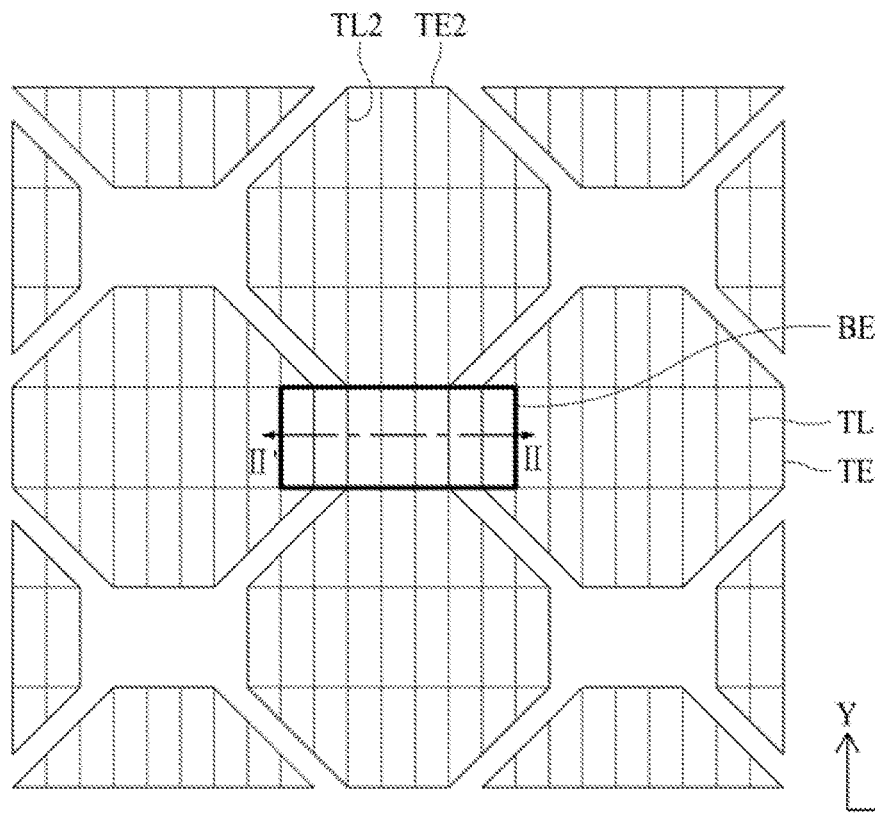
FIG. 6 is an enlarged plane view illustrating first touch electrodes and second touch electrodes in a display panel according to another embodiment of the present disclosure.

FIG. 6 is an enlarged plane view illustrating first touch electrodes and second touch electrodes in a display panel according to another embodiment of the present invention. For convenience of explanation, FIG. 6 shows only first touch electrodes (TE1), second touch electrodes (TE2), and bridge electrode (BE).

Referring to FIG. 6, first touch electrodes (TE1) arranged in the first direction (X-axis direction) are connected with one another, and second touch electrodes (TE2) arranged in the second direction (Y-axis direction) are connected with one another. The first direction (X-axis direction) may be parallel to scan lines (S1~Sn) and the second direction (Y-axis direction) may be parallel to data lines (D1~Dm), or the first direction (X-axis direction) may be parallel to the data lines (D1~Dm) and the second direction (Y-axis direction) may be parallel to the scan lines (S1~Sn).

Each of the first touch electrodes (TE1) connected in the first direction (X-axis direction) is electrically insulated from the first touch electrodes (TE1) neighboring in the second direction (Y-axis direction). Each of the second touch electrodes (TE2) connected in the second direction (Y-axis direction) is electrically insulated from the second touch electrodes (TE2) neighboring in the first direction (X-axis direction).

The first touch electrodes (TE1) connected in the first direction (X-axis direction) may be connected with any one of first touch sensing lines (T1~Tj) connected with a Tx driver 41. Accordingly, the first touch electrodes (TE1) connected in the first direction (X-axis direction) may be supplied with a driving pulse from the Tx driver 41.

The second touch electrodes (TE2) connected in the second direction (Y-axis direction) may be connected with any one of second touch sensing lines (R1~Ri) connected with an Rx driver 42. Accordingly, the Rx driver 42 may be supplied with the change of charge amount in touch sensors from the second touch electrodes (TE2) connected in the second direction (Y-axis direction). The touch sensors may be the mutual capacitance formed between the first touch electrodes (TE1) and the second touch electrodes (TE2).

Figure 7:
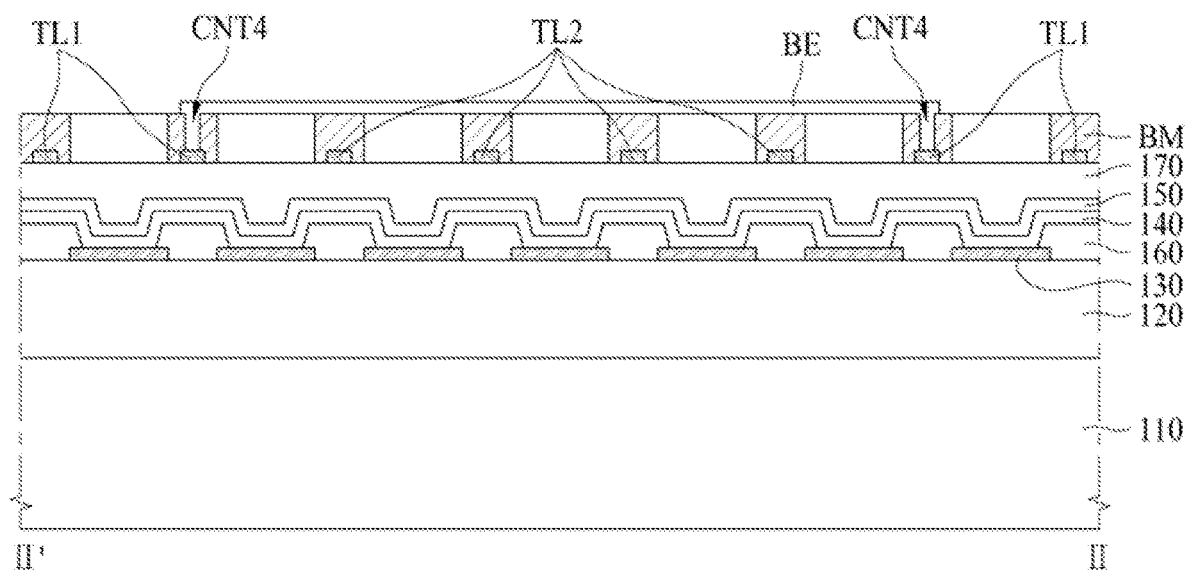
FIG. 7 is a cross sectional view illustrating one example along II-II' of FIG. 6.
Figure 8:
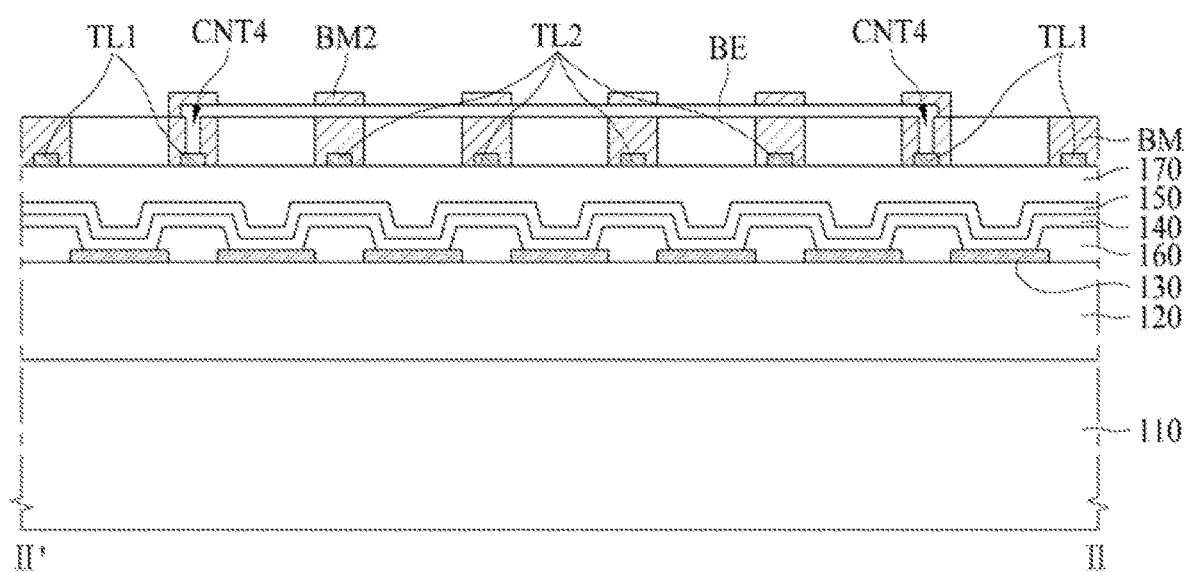
FIG. 8 is a cross sectional view illustrating another example along of FIG. 6.

Each of the first touch electrodes (TE1) may include first touch lines (TL1) arranged in a mesh-type configuration. Preferably, the first touch lines (TL1) are formed of an opaque metal material so as to lower a resistance. As shown in FIGS. 7 and 8, the first touch lines (TL1) may be covered by a black matrix (BM).

Each of the second touch electrodes (TE2) may include second touch lines (TL2) arranged in a mesh-type configuration. The second touch electrodes (TE2) may be connected with the touch electrodes (TE2) neighboring in the second direction (Y-axis direction) through the second touch lines (TL2) arranged in the mesh-type configuration. Preferably, the second touch lines (TL2) are formed of an opaque metal material so as to lower a resistance. As shown in FIGS. 7 and 8, the second touch electrodes (TE2) may be covered by a black matrix (BM).

As shown in FIGS. 7 and 8, the first and second touch electrodes (TE1, TE2) are formed in the same layer. The second touch electrodes (TE2) are connected with the second touch electrodes (TE2) neighboring in the second direction (Y-axis direction) through the second touch lines (TL2), whereby the first touch electrodes (TE1) are electrically connected with the first touch electrodes (TE1) neighboring in the first direction (X-axis direction) through the bridge electrode (BE). That is, the bridge electrode (BE) is provided to prevent a short between the first touch electrode (TE1) and the second touch electrode (TE2), and also to connect the first touch electrodes arranged in the first direction (X-axis direction). The bridge electrode (BE) may be formed of a transparent electrode such as ITO or IZO.

FIG. 6 shows that the first touch electrodes (TE1) are electrically connected through the bridge electrode (BE), but the embodiment is not limited thereto. That is, the second touch electrodes (TE2) may be electrically connected through the bridge electrode (BE), and the first touch electrodes (TE1) may be electrically connected through the first touch line (TL1). A detailed description for a position in the first touch electrodes (TE1), the second touch electrodes (TE2), and the bridge electrode (BE) will be described in detail with reference to FIGS. 7 and 8.

In FIG. 6, each of the first touch electrodes (TE1) and the second touch electrodes (TE2) has a plane shape of a hexahedron, but not limited to this shape.

FIG. 7 is a cross sectional view illustrating one example along II-II' of FIG. 6. A TFT layer 120 shown in FIG. 7 is the same as the TFT layer shown in FIG. 4, whereby a detailed description for the TFT layer will be omitted. Also, anode electrodes 130, an organic light emitting layer 140, a cathode electrode 150, banks 160, and an encapsulation layer 170 shown in FIG. 7 are the same as those described with reference to FIG. 3A, whereby a detailed description for those shown in FIG. 7 will be omitted.

Referring to FIG. 7, first and second touch electrodes (TE1, TE2), made up of lines (TL1, TL2) are provided on the encapsulation layer 170. The first and second touch electrodes (TE1, TE2), made up of lines (TL1, TL2) may be formed of an opaque metal material, and the first and second touch lines (TL1, TL2) may be disposed in the areas corresponding to the banks 160.

Also, a black matrix (BM) and color filters (CF) are provided on the encapsulation layer 170. The black matrix (BM) is provided in the areas corresponding to the banks 160, whereby the first and second touch electrodes (TE1, TE2) are covered by the black matrix (BM).

The color filters (CF) are provided every black matrix (BM). Each of the color filters (CF) may be any one among red, green, and blue color filters, but not limited to these colors.

A bridge electrode (BE) may be provided on the black matrix (BM) and the color filters (CF). The bridge electrode (BE) may be in contact with the first touch electrodes (TE1) via a fourth contact hole (CNT4) for exposing the first touch electrodes (TE1) through the black matrix (BM). Thus, the first touch electrodes (TE1) arranged in the first direction (X-axis direction) may be electrically connected with one another through the bridge electrode (BE).

In order to lower a resistance, the first and second touch electrodes (TE1, TE2) are formed of a conductive material with low resistance, preferably. Thus, the first and second touch electrodes (TE1, TE2) are formed of an opaque metal material such as copper (Cu) or aluminum (Al) instead of a transparent metal material such as ITO or IZO. According as the first and second touch electrodes (TE1, TE2) are formed of the opaque metal material, the first and second touch electrodes (TE1, TE2) are covered by the black matrix (BM) so as to prevent a loss of an open area, preferably.

As described above, the first and second touch electrodes (TE1, TE2) are formed in the same layer as the black matrix (BM) and the color filters (CF). As a result, even though the touch electrodes are formed in the in-cell type display panel, the distance between the organic light emitting layer and the color filter is not increased so that it is possible to prevent a luminance from being changed in accordance with a viewing angle. Also, the touch lines are formed in the lower substrate, whereby there is no need for an additional process of connecting the touch lines provided in the upper substrate with the Tx driver and the Rx driver provided in the lower substrate.

FIG. 8 is a cross sectional view illustrating another example along II-II' of FIG. 6. A TFT layer 120 shown in FIG. 8 is the same as the TFT layer shown in FIG. 4, whereby a detailed description for the TFT layer will be omitted. Also, anode electrodes 130, an organic light emitting layer 140, a cathode electrode 150, banks 160, and an encapsulation layer 170 shown in FIG. 8 are the same as those described with reference to FIG. 3A, whereby a detailed description for those shown in FIG. 8 will be omitted. Furthermore, first and second touch electrodes (TE1, TE2), bridge electrode (BE), and black matrix (BM) and color filters (CF) shown in FIG. 8 are the same as those described with reference to FIG. 7, whereby a detailed description for those shown in FIG. 8 will be omitted.

Referring to FIG. 8, another black matrix (BM2) may be provided in the area corresponding to one black matrix (BM), wherein another black matrix (BM2) may be provided on bridge electrodes (BE). For a cost reduction, if a polarizing plate for preventing a reflection of external light is not attached to an upper substrate, another black matrix (BM2) may be provided to minimize a reflection of external light by the bridge electrode (BE).

By way of summation and review, the first and second touch electrodes may be formed in the same layer as the black matrix and the color filters, or may be formed on the black matrix and the color filters. As a result, even though the touch electrodes are formed in the in-cell type display panel, the distance between the organic light emitting layer and the color filter is not increased so that it is possible to prevent a luminance from being changed in accordance with a viewing angle.

Also, the touch lines are formed in the lower substrate, whereby there is no need for an additional process of connecting the touch lines provided in the upper substrate with the Tx driver and the Rx driver provided in the lower substrate.

In addition, the touch lines are formed of the conductive material with low resistance, that is, the touch lines are formed of the opaque material instead of the transparent material, whereby the touch lines are covered by the black matrix. As a result, the touch electrodes include the touch lines arranged in the mesh-type configuration, to thereby prevent a loss of an open area by the touch lines.

Also, another black matrix may be provided in the area corresponding to one black matrix, wherein another black matrix may be provided on the bridge electrode. For a cost reduction, if a polarizing plate for preventing a reflection of external light is not attached to an upper substrate, another black matrix may be provided to minimize a reflection of external light by the bridge electrode.

It will be apparent to those skilled in the art that various modifications and variations can be made to embodiments of the present invention without departing from the spirit or scope of the invention. Thus, it is intended that the present invention covers the modifications and variations of this invention provided they come within the scope of the appended claims and their equivalents.

What is claimed is:

1. A display device, comprising:
a substrate including a display area;
a display element in the display area on the substrate, the display element including a bank between at least two anode electrodes;
a planarization layer on the display element;
a touch sensor on the planarization layer in the display area of the substrate, the touch sensor including a touch electrode and a touch line;
a plurality of black matrix elements on the planarization layer, the plurality of black matrix elements including a first black matrix element and a second black matrix element spaced apart from the first black matrix element, the first black matrix element having a first side surface and a second side surface opposite the first side surface, the second black matrix element having a third side surface facing the second side surface;
at least one color filter disposed between adjacent black matrix elements of the plurality of black matrix elements, a first color filter of the at least one color filter located between the second side surface of the first black matrix element and the third side surface of the second black matrix element;
a touch sensing line electrically connected to the touch sensor and disposed in an area of the substrate other than the display area; and
a bridge electrode extending in a horizontal direction to extend through the first side surface of the first black matrix element, the second side surface of the first black matrix element, and overlap the first color filter, the bridge electrode extending through the third side surface of the second black matrix element and further extending in a vertical direction to electrically connect to the touch sensor, wherein the touch line is disposed on a same layer as the first black matrix element, and the first black matrix element covers the touch line.

2. The display device of claim 1, wherein the touch sensor includes:
a first touch sensor arranged in a first direction;
a second touch sensor arranged in a second direction; and
an insulating layer between the first touch sensor and the second touch sensor.

3. The display device of claim 1, wherein the touch line has mesh-type configuration within the touch electrode.

4. The display device of claim 3, wherein the display element includes:
an organic emitting layer on the anode electrodes; and
a cathode electrode on the organic emitting layer.

5. The display device of claim 1, further comprising:
an insulating layer between the bridge electrode and the touch sensor,
wherein the bridge electrode is electrically connected to the touch sensor through a contact hole penetrating the insulating layer.

6. The display device of claim 5, wherein the bridge electrode is disposed on the planarization layer, and the touch sensor is disposed on the insulating layer.

7. The display device of claim 5, wherein the touch sensor is disposed on the planarization layer, and the bridge electrode is disposed on the insulating layer.

8. The display device of claim 5, wherein the touch sensor includes:
first touch electrodes;
second touch electrodes on a same layer as the first touch electrodes; and
touch lines coupled to the first touch electrodes,
wherein the bridge electrode is coupled to the second touch electrodes.

9. The display device of claim 8, wherein the touch lines electrically connect the first touch electrodes in a first direction, and
wherein the bridge electrode electrically connects the second touch electrodes in a second direction.

10. The display device of claim 8, wherein the touch line and the bridge electrode have a mesh-type configuration.

11. The display device of claim 10, wherein the bridge electrode is overlapping with at least three touch lines having the insulating layer there-between.

12. The display device of claim 10, wherein the display element includes:
an organic emitting layer on the at least two anode electrodes; and
a cathode electrode on the organic emitting layer.

13. The display device of claim 1, wherein the display element includes:
an organic emitting layer on the at least two anode electrodes; and
a cathode electrode on the organic emitting layer,
wherein the touch line electrically connects the touch electrode to the touch sensing line.

14. The display device of claim 13, wherein the touch sensor includes an opaque metal material.

15. A display device, comprising:
a substrate including a display area;
a display element in the display area on the substrate, the display element including a bank between anode electrodes;
a planarization layer on the display element;
a bridge electrode on the planarization layer in the display area of the substrate;
a touch sensor on the planarization layer in the display area of the substrate;
a plurality of black matrix elements on the planarization layer, the plurality of black matrix elements including a first black matrix element and a second black matrix element spaced apart from the first black matrix element, the first black matrix element having a first side surface and a second side surface opposite the first side surface, the second black matrix element having a third side surface facing the second side surface;
at least one color filter disposed between adjacent black matrix elements of the plurality of black matrix elements, a first color filter of the at least one color filter located between the second side surface of the first black matrix element and the third side surface of the second black matrix element;
an insulating layer between the bridge electrode and the touch sensor; and
a touch sensing line electrically connected to the touch sensor and disposed in an area of the substrate other than the display area;
wherein the touch sensor includes:
first touch electrodes;
second touch electrodes on a same layer as the first touch electrodes; and
touch lines,
wherein touch lines are disposed on a same layer as the plurality of black matrix elements, and the plurality of black matrix elements cover the touch lines,
wherein the bridge electrode extends in a horizontal direction to extend through the first side surface of the first black matrix element, the second side surface of the first black matrix element, and overlap the first color filter, the bridge electrode extending through the third side surface of the second black matrix element and further extending in a vertical direction to electrically connect to the touch sensor, and
wherein a portion of the first black matrix element is disposed above the bridge electrode.

16. The display device of claim 15, wherein the bridge electrode is disposed on the planarization layer, and the touch sensor is disposed on the insulating layer.

17. The display device of claim 15, wherein the touch sensor is disposed on the planarization layer, and the bridge electrode is disposed on the insulating layer.

18. The display device of claim 15, wherein
the touch lines electrically connect to the first touch electrodes in a first direction,
wherein the bridge electrode electrically connects the second touch electrodes.

19. The display device of claim 18, wherein the bridge electrode electrically connects the second touch electrodes in a second direction.

20. The display device of claim 18, wherein at least one of the touch lines and the bridge electrode has a mesh-type configuration.

21. The display device of claim 20, wherein the bridge electrode is overlapping with at least three touch lines having the insulating layer there-between.

22. The display device of claim 20, wherein the display element includes:
an organic emitting layer on the anode electrodes; and
a cathode electrode on the organic emitting layer,
wherein the touch line and the bridge electrode are overlie the bank.

23. The display device of claim 22, wherein the touch sensor includes an opaque metal material.

* * * * *